United States Patent [19]

Mizoguchi et al.

[11] Patent Number: 4,816,831
[45] Date of Patent: Mar. 28, 1989

[54] ANALOG-DIGITAL CONVERTER REALIZING HIGH INTEGRATION WITH HIGH RESOLUTION ABILITY

[75] Inventors: Satoshi Mizoguchi; Yasuhiro Sugimoto, both of Yokohama; Shoichi Shimizu, Fujisawa, all of Japan

[73] Assignee: Kabushiki Kaisha Toshiba, Kawasaki, Japan

[21] Appl. No.: 102,495

[22] Filed: Sep. 29, 1987

[30] Foreign Application Priority Data

Sep. 30, 1986 [JP] Japan .................................. 61-23243

[51] Int. Cl.$^4$ ............................................ H03F 13/175
[52] U.S. Cl. ................................................... 341/156
[58] Field of Search .................... 340/347 AD, 347 M

[56] References Cited

U.S. PATENT DOCUMENTS

| | | | |
|---|---|---|---|
| 3,582,939 | 6/1971 | Campbell | 340/347 M X |
| 4,083,043 | 4/1978 | Breuer | 340/347 AD |
| 4,276,543 | 6/1981 | Miller et al. | 358/13 X |
| 4,542,370 | 9/1985 | Yamada et al. | 307/361 X |

FOREIGN PATENT DOCUMENTS 58-69112  4/1983  Japan .

*Primary Examiner*—Vit W. Miska
*Attorney, Agent, or Firm*—Foley & Lardner, Schwartz, Jeffery, Schwaab, Mack, Blumenthal & Evans

[57] ABSTRACT

An analog-digital converter comprises a first comparing-converting device for comparing analog input voltages and a plurality of primary reference voltages at different levels, respectively, and converting the analog input voltages to digital signals on the most significant bit sides; a reference voltage generating device for generating a plurality of secondary reference voltages at different levels from the primary reference voltages supplied to both terminals of the reference voltage generating device; a switching device for supplying the primary reference voltage most close in sequential order to the analog input voltages to the reference voltage generating device in accordance with the compared results of the first comparing-converting device; a second comparing-converting device for converting the compared results between the analog input voltages and the secondary reference voltages to signals corresponding to digital signals on the least significant bit side with respect to the analog input voltages; and a selecting device for selecting signals based on the outputs of the second comparing-converting device in accordance with the potential relation of both input terminals of the reference voltage generating device to provide digital signals on the least significant bit side with respect to the analog input voltages.

6 Claims, 3 Drawing Sheets

ANALOG-DIGITAL CONVERTER REALIZING HIGH INTEGRATION WITH HIGH RESOLUTION ABILITY

The present invention relates to an analog-digital converter suitable for high resolution ability and high integration.

BACKGROUND OF THE INVENTION

Various kinds of analog-digital converters have been used in accordance with required accuracy and transformation speed FIG. 1 shows a conventional analog-digital converter of a parallel-comparison type for example, which is disclosed in Japanese Laid-Open Patent No. 58-69112.

The A/D converter of FIG. 1 converts analog input signals to digital signals of four bits comprising a sum of the most significant two bits and the least significant two bits. The analog input signals are sample-held by a sample-hold circuit 11, and are respectively input to three comparators 12a, 12b and 12c disposed in parallel with each other. Primary reference voltages at predetermined levels are provided for the respective comparators 12a, 12b and 12c, and are generated by a reference voltage generator 13 comprising four resistors 13a, 13b, 13c and 13d connected in series to each other. The analog input signals are respectively compared in voltage level with the primary reference voltages in the comparators 12a, 12b and 12c. The comparators 12a, 12b and 12c respectively output "1" as the compared results when the analog input voltages are greater than and equal to the respective primary reference voltages, and output "0" in the other case.

These outputs are supplied to exclusive logical sum circuits(EX-ORs) 14a, 14b, 14c and 14d disposed in parallel with each other, and are logically processed in them. The respective logical outputs of these EX-ORs 14a, 14b, 14c and 14d are supplied to an encoder 15 and are encoded therein to obtain digital signals of the most significant two bits in the analog input signals.

The primary reference voltages $V_{ref}$, $V_{11}$, $V_{10}$, $V_{01}$, and $V_{00}$ generated in the reference voltage generator 13 are supplied to switching circuits 16a, 16b, 16c and 16d selectively controlled by the outputs of the EX-ORs. These switching circuits 16a, 16b, 16c and 16d supply the primary reference voltages most close to the levels of the analog input signals with respect to the primary reference voltages $V_{ref}$, $V_{10}$, and $V_{00}$ in the odd sequential order, to one terminal of a potential divider 17 constituted by four resistors 17a, 17b, 17c and 17d connected in series to each other. These switching circuits also supply to the other terminal of the potential divider 17 the primary reference voltages most close to the levels of the analog input signals with respect to the primary reference voltages $V_{11}$ and $V_{01}$ in the even sequential order.

The potential divider 17 equally divides the supplied primary reference voltages and generates secondary reference voltages $V_{11}$, $V_{10}$, and $V_{01}$, and supplies the secondary reference voltages to the comparators 18a, 18b and 18c to which the analog input signals are input. The comparators 18a, 18b and 18c compare the voltage levels of the analog input signals and the secondary reference voltages. The compared results by the respective comparators 18a, 18b and 18c are supplied to the encoder 20 through a switching circuit 19, and are encoded therein to obtain digital signals of the least significant two bits in the analog input signals.

The switching of the switching circuit 19 is controlled by an OR circuit 21 for logically summing the outputs of EX-ORs 14a and 14c to inverse the bit sequential order in the outputs of the comparators 18a, 18b and 18c. The high and low levels of the secondary reference voltages supplied to the potential divider 17 are inverted in accordance with the levels of the analog input signals so that the compared results are inverted with respect to the secondary reference voltages The inverse operation of the switching circuit 19 is performed to compensate the inverted compared results. Such a switching circuit 19 may be constituted by a plurality of pair transistors for performing the switch operation by switching electrical current paths as shown in FIG. 2.

As mentioned above, the compared results of the respective comparators 18a, 18b and 18c are inverted by the switching circuit 19 to compensate the inversion of the high and low levels of the secondary reference voltages supplied to the potential divider 17, and are supplied to the encoder 20.

Accordingly, the number of switches constituting the switching circuit 19 are increased as the increase of the number of comparators for comparing the analog input signals and the secondary reference voltages When the number of bits on the least significant bit side representing resolution ability in the digital signals is n, it is necessary to dispose $(2^n - 2)$ switches. Therefore, the number of switches constituting the switching circuit 19 is exponentially increased as the increase of the resolution ability. Further, it is necessary to dispose $\{2 \times (2^n - 2) + 1\}$ wirings for connecting from the comparators for comparing the analog input signals and the secondary reference voltages to the switches constituting the switching circuit 19. Accordingly, the number of wirings also is exponentially increased as the increase of the resolution ability.

These problems result in the increases of the number of elements and wiring regions when an A/D converter is integrated, and are hindrances to high integration in the A/D converter having high resolution ability.

SUMMARY OF THE INVENTION

With the above problems in view, an object of the present invention is to provide an analog-digital converter in which the construction of a circuit is partially simplified to realize high integration with high resolution ability without adversely affecting speed and accuracy.

With the above object in view, an analog digital converter in the present invention comprises a first comparing means for respectively comparing analog input voltages and a plurality of primary reference voltages at different levels, a first converting means for converting the analog input voltages to digital signals on the most significant bit side in accordance with the compared results of the first comparing means, a reference voltage generating means for generating a plurality of secondary reference voltages at different levels from the primary reference voltages supplied to both input terminals of the reference voltage generating means, switching means for supplying to one input terminal of the reference voltage generating means the primary reference voltages in the odd sequential order most close to the analog input voltages in accordance with the compared results of the first comparing means, said switching means supplying to the other input terminal of the reference voltage generating means the primary reference voltages in the even sequential order most close to the analog input voltages, a second comparing means for comparing the analog input voltages and the secondary reference voltages, a second converting means for converting the compared results of the second comparing means to codes corresponding to digital signals of the least significant bit side with respect to the analog input voltages, selecting means for selecting the codes output from the second converting means or their inverted codes in accordance with the voltage relation between both input terminals of the reference voltage generating means to obtain digital signals on the least significant bit side with respect to the analog input voltages.

In the analog-digital converter in the present invention, digital signals on the most significant bit side with respect to the analog input voltages are obtained in accordance with the compared results between the analog input voltages and the primary reference voltages. The compared results between the analog input voltages and the secondary reference voltages are converted to codes corresponding to digital signals on the least significant bit side with respect to the analog input voltages. These codes or their inverted codes are selected in accordance with the compared results between the analog input voltages and the primary reference voltages to obtain digital signals on the least significant bit side with respect to the analog input voltages.

BRIEF DESCRIPTION OF THE DRAWINGS

The present invention will be more apparent from the following description of the preferred embodiments in conjunction with the accompanying drawings in which.

DETAILED DESCRIPTION OF THE PREFERRED EMBODIMENTS

The preferred embodiments of the present invention will next be described in detail with reference to the drawings.

Figure 1:
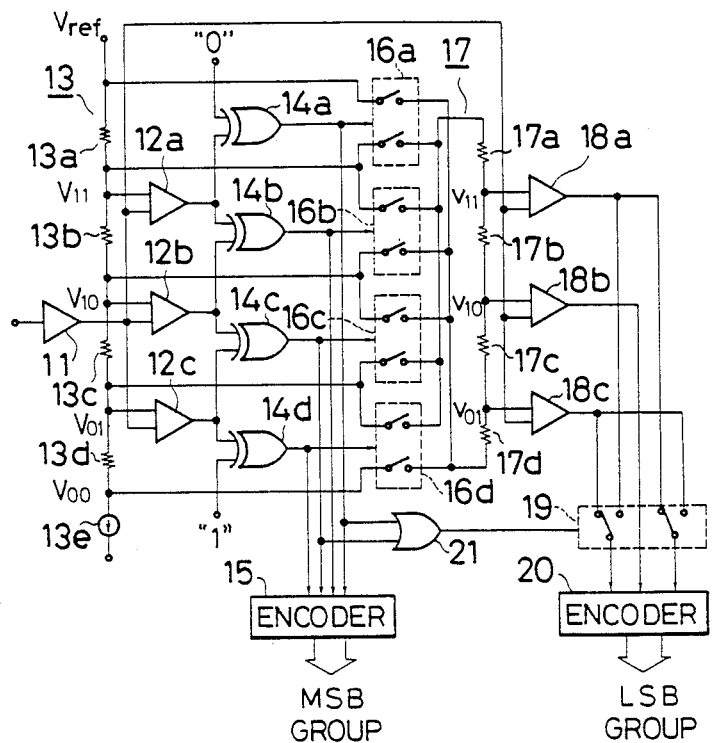
FIG. 1 is a view showing the construction of a conventional analog-digital converter.
Figure 2:
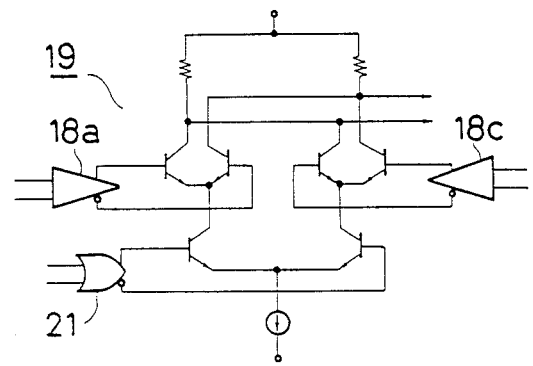
FIG. 2 is a view showing the construction of an embodiment of a switching circuit in FIG. 1.
Figure 3:
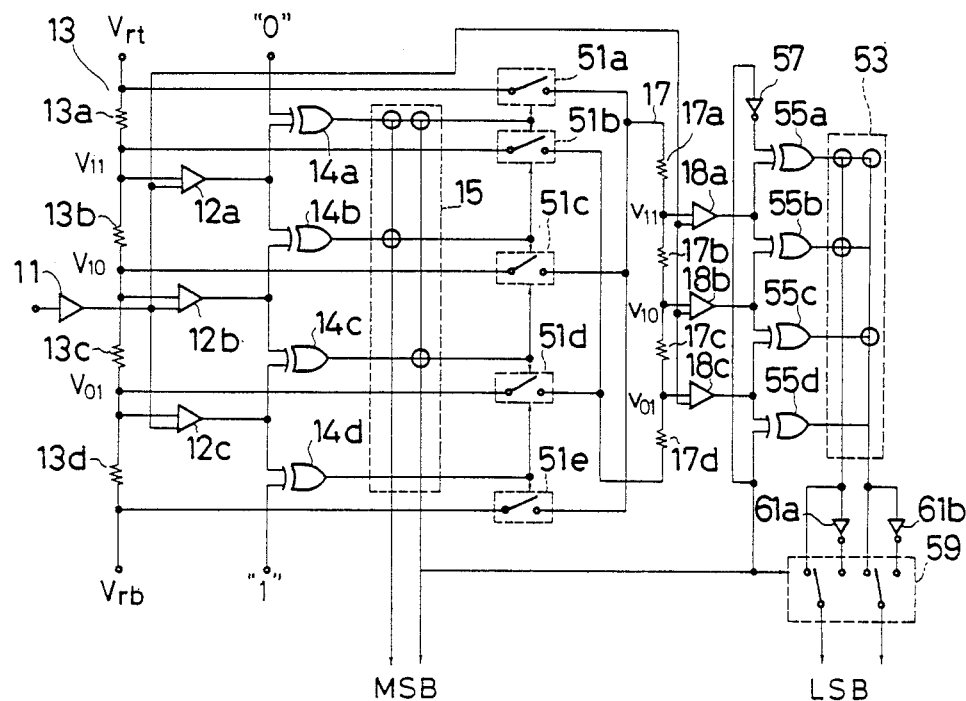
FIG. 3 is a view showing the construction of an analog-digital converter in accordance with one embodiment of the present invention.

FIG. 3 is a view showing the construction of an analog-digital converter in accordance with one embodiment of the present invention. The analog-digital converter in FIG. 3, similar to the one shown in FIG. 1, converts analog input signals to digital signals of four bits comprising a sum of the most significant two bits and the least significant two bits. The compared results between the analog input signals and secondary reference voltages are encoded by an encoder, and complement of 1 is calculated with respect to the encoded results to obtain digital signals of the least significant two bits in the analog input signals. In FIG. 3, the same reference numerals as the ones in FIG. 1 have the same functions as the ones in FIG. 1.

In FIG. 3, analog input signals are sample-held by a sample-hold circuit 11, and are compared in voltage level by respective comparators 12a, 12b and 12c with primary reference voltages generated by a reference voltage generator 13. The compared results are logically processed by respective EX-ORs 14a, 14b, 14c and 14d, and are supplied to an encoder 15. The encoder 15 performs an OR logical process of respective outputs of the EX-ORs 14a and 14c, and an OR logical process of respective outputs of the EX-ORs 14a and 14b, to obtain digital signals of the most significant two bits with respect to the analog input signals.

The primary reference voltages generated by the reference voltage generator 13 are supplied to switching circuits 51a, 51b, 51c, 51d and 51e in which the switching is controlled by the outputs of the EX-ORs 14a, 14b, 14c and 14d. These switching circuits 51a, 51b, 51c, 51d and 51e select a primary reference voltage closest to an analog input voltage $V_{in}$ with respect to the primary reference voltages $V_{rt}$, $V_{10}$ and $V_{rb}$ in the odd sequential order, and supplies it to one terminal of a potential divider 17. These switching circuits also select a primary reference voltage closest to the analog input voltage $V_{in}$ with respect to the primary reference voltages $V_{11}$ and $V_{01}$ in the even sequential order, and supply it to the other terminal of the potential divider 17. Thus, secondary reference voltages are generated by the primary reference voltages supplied to the potential divider 17. The secondary reference voltages and the analog input signals are compared in voltage level with each other by comparators 18a, 18b and 18c.

The compared results are supplied to four EX-ORs 55a, 55b, 55c and 55d disposed in parallel with each other. The EX-OR 55a inputs a signal provided by inverting an OR logic between the EX-ORs 14a and 14c by an inverter circuit 57, and inputs an output of the comparator 18a. The EX-OR 55b inputs outputs of the comparators 18a and 18b, and the EX-OR 55c inputs outputs of the comparators 18b and 18c. The EX-OR 55d inputs OR logic signals of the respective outputs of the EX-ORs 14a and 14c, and inputs an output of the comparator 18c, and performs a logical operation therebetween. The EX-OR 55d may be omitted.

Figure 4:
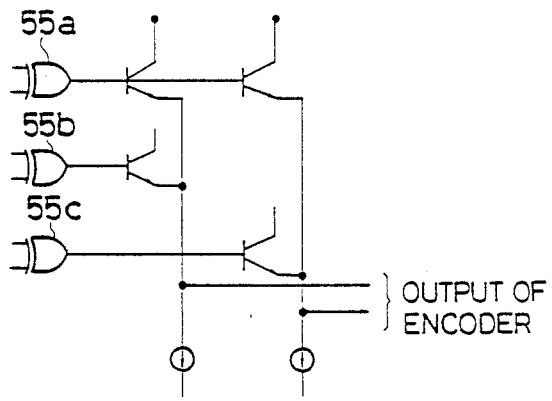
FIG. 4 is a view showing the construction of an embodiment of an encoder in FIG. 3.

The outputs of the EX-ORs 55a, 55b, 55c and 55d are supplied to an encoder 53. The encoder 53 performs OR logical operations of the respective outputs of the EX-ORs 55a and 55c, and these logical outputs are one outputs of the encoder 53. The encoder 53 performs OR logical operations of the respective outputs of the EX-ORs 55a and 55b, and these logical outputs are the other outputs of the encoder 53. Such an encoder 53 may be constructed as in FIG. 4. This encoder performs the encoding operation by controlling transistors arranged in series with respect to an electric current path using the outputs of the EX-ORs 55a, 55b and 55c. The outputs of the encoder 53 are supplied to inverter circuits 61a and 61b, and are inverted therein so as to calculate the complement of 1 with respect to these outputs. The respective inverted outputs and the respective outputs of the encoder 53 are supplied to a selecting circuit 59 constituted by switches selectively switched by the OR logical signals of the outputs of the EX-ORs 14a and 14c. The selecting circuit 59 selects the outputs of the encoder 53 or their inverted outputs according to the levels of the primary reference voltages at which the analog input voltages are located, obtaining digital signals of the least significant two bits with respect to the analog input signals.

Namely, when the analog input voltage $V_{in}$ is located between the primary reference voltages $V_{rt}$ and $V_{11}$ or between the primary reference voltages $V_{10}$ and $V_{01}$, the outputs of the encoder 53 are selected. When the analog input voltage $V_{in}$ is located between the primary reference voltages $V_{11}$ and $V_{10}$ or between the primary reference voltages $V_{01}$ and $V_{rb}$, the inverted outputs of the encoder 53 are selected. The high and low levels of the primary reference voltages supplied to both terminals of the potential divider 17 in the first case in which the analog input signal is located between the primary reference voltages $V_{rt}$ and $V_{11}$ or between the primary reference voltages $V_{10}$ and $V_{01}$, are inverted to each other in the second case in which the analog input signal is located between the primary reference voltages $V_{11}$ and $V_{10}$ or between the primary reference voltages $V_{O1}$ and $V_{rb}$, so that the compared results between the analog input voltage and the secondary reference voltages are different from each other in the first and second cases. This is compensated by selecting the outputs of the encoder 53 in the first case and the inverted outputs of the encoder 53 in the second case, as described above.

Figure 5:
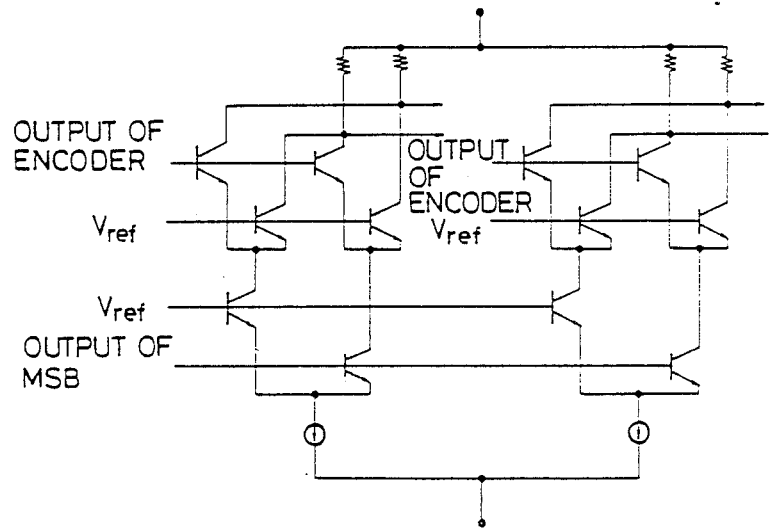
FIG. 5 is a view showing the construction of embodiments of an inverter circuit for inverting outputs of the encoder in FIG. 3 and a circuit having the function of a selecting circuit.

The selecting circuit 59 including the inverter circuits 61a and 61b may have a constitution shown in FIG. 5. Differential pairs of transistors are controlled by the outputs of the encoder 53, by the outputs of the most significant two bits of the digital signals and the reference voltage $V_{ref}$, and by the reference voltage $V_{ref}$ to switch paths of electric currents flowing through the transistors, thereby performing the switching operation.

With respect to the least significant two bits of the digital signals, there are the following two cases, i.e., a third case in which the analog input voltage is located between the primary reference voltages $V_{11}$ and $V_{10}$, and a fourth case in which the analog input voltage is located between the primary reference voltages $V_{10}$ and $V_{01}$.

In the third case, the output of the comparator 12a is "0", and the outputs of the comparators 12b and 12c are "1". Thus, only the output of EX-OR 14b becomes "1", and the switching circuits 51b and 51c become in the current flowing state, so that the primary reference voltage $V_{10}$ is supplied to one terminal of the resistor 17a constituting the potential divider 17, and the primary reference voltage $V_{11}$ is supplied to one terminal of the resistor 17d, thereby generating secondary reference voltages $V_{11}$, $V_{10}$ and $V_{01}$.

When the analog input voltage $V_{in}$ is located between the secondary reference voltages $V_{11}$ and $V_{10}$, the output of the comparator 18a is "1", and the outputs of the comparators 18b and 18c are "0" so that only the output of EX-OR 55b becomes "1", and the outputs of EX-ORs 55a, 55c and 55d become "0", and the one output of the encoder 53 becomes "1" and the other output of the encoder 53 becomes "0".

Since the analog input voltage $V_{in}$ is located between the primary reference voltages $V_{11}$ and $V_{10}$, the selecting circuit 59 switches the switches thereof on the output side of the inverter circuits 61a and 61b, thereby obtaining "0, 1" as digital signals of least significant two bits of the analog input signals.

When the analog input voltage $V_{in}$ is located between the primary reference voltages $V_{10}$ and $V_{01}$, the outputs of the comparators 12a and 12b become "0", and the output of the comparator 12c becomes "1". Thus, only the output of EX-OR 14c becomes "1", and the switching circuits 51c and 51d become in the current flowing state, so that the primary reference voltage $V_{10}$ is supplied to one terminal of the resistor 17a constituting the potential divider 17, and the primary reference voltage $V_{01}$ is supplied to the other terminal of the resistor 17d, thereby generating secondary reference voltages.

When the analog input voltage $V_{in}$ is located between the secondary reference voltages $V_{10}$ and $V_{01}$, i.e., when the analog input voltage in the above case and the secondary reference voltage are same at the levels thereof, the outputs of the comparators 18a and 18b become "0", and the output of the comparator 18c becomes "1" so that only the output of EX-OR 55c becomes "1" and the outputs of EX-ORs 55a, 55b and 55d become "0", and the one output of the encoder 53 becomes "0", and the other output of the encoder 53 becomes "1".

Since the analog input voltage $V_{in}$ is located between the primary reference voltages $V_{10}$ and $V_{01}$, the selecting circuit 59 switches the switches thereof on the output side of the encoder 53, thereby obtaining "0, 1" as digital signals of least significant two bits of the analog input signals.

Accordingly, even when the low and high levels of the primary reference voltages supplied to the potential divider 17 are inverted, digital signals of the accurate least significant two bits of the analog input signals can be obtained by selecting the outputs of the encoder 53 or the inverted outputs of the encoder 53 in accordance with the levels of the analog input signals with respect to the primary reference voltages.

Since the digital signals of the least significant two bits are thus obtained by selecting the outputs of the encoder 53 or the inverted output thereof, it is sufficient to dispose n switches constituting the selecting circuit 59 when the number of least significant bits is n, and it is sufficient to dispose $(2^n - 1)$ output wirings of the comparators 18a, 18b and 18c, thereby greatly reducing the number of elements and regions for wiring.

In this embodiment, the analog input signals are converted to digital signals comprising the most significant two bits and the least significant two bits. However, the number of converted bits are not limited to this embodiment, and the number of most and least significant bits may be decided in accordance with required resolution ability.

As mentioned above, according to the present invention, the compared results between analog input voltages and secondary reference voltages are converted to codes corresponding to digital signals on the least significant bit side with respect to the analog input voltages. These codes or their inverted codes are selected in accordance with the compared results between the analog input voltages and primary reference voltages to obtain digital signals on the least significant bit side with respect to the analog input voltages. In the structure for obtaining digital signals on the least significant bit side from the compared results between the analog input voltages and the secondary reference voltages, the number of elements and regions for wiring are greatly reduced as the increase of resolution ability, thereby realizing high integration and high resolution of an analog-digital converter.

What is claimed is:

1. An analog-digital converter comprising:
   first comparing-converting means for comparing analog input voltages and a plurality of primary reference voltages at different levels, respectively, and converting the analog input voltages to digital signals on a most significant bit side;

reference voltage generating means for generating a plurality of secondary reference voltages at different levels from the primary reference voltages supplied to both terminals of the reference voltages supplied to both terminals of the reference voltage generating means;

switching means for supplying the primary reference voltage closest in sequential order to the analog input voltages to the reference voltage generating means in accordance with compared results of said first comparing-converting means;

second comparing-converting means for converting the compared results between the analog input voltages and the secondary reference voltages to signals corresponding to digital signals on a least significant bit side with respect to the analog input voltages; and selecting means for selecting signals based on outputs of the second comparing-converting means in accordance with a potential relation of both input terminals of said reference voltage generating means to provide digital signals on the least significant bit side with respect to the analog input voltages, said selecting means having an encoding section including a plurality of exclusive logical sum gates in which inputs of the upper and lower gates are changed by upper and lower polarities of the reference voltage generating means.

2. An analog-digital converter as claimed in claim 1, wherein said switching means supplies the primary reference voltage most close in the odd sequential order to the analog input voltages to one input terminal of said reference voltage generating means, and supplies the primary reference voltage most close in the even sequential order to the analog input voltages to another input terminal of said reference voltage generating means.

3. An analog-digital converter as claimed in claim 2, wherein said selecting means selects the output signals of the second comparing-converting means or the inverted signals thereof in accordance with the potential relation of said both terminals of the reference voltage generating means.

4. An analog-digital converter as claimed in claim 1, wherein the encoding section encodes the outputs from said second comparing-converting means, and the selecting outputs of the encoding section or the inverted outputs thereof in accordance with levels of the primary reference voltages at which the analog input voltages are located.

5. An analog-digital converter as claimed in claim 4, wherein the outputs of the encoding section are supplied to an invertor circuit and are inverted therein to calculate the complements of the outputs of the encoding section, and said selecting circuit comprises switches inputting said inverted outputs and the outputs of the encoding section and selectively controlling the switching of these outputs.

6. An analog-digital converter as claimed in claim 5, wherein said selecting circuit performs the switching operation by switching electric current paths flowing through pairs of transistors.

* * * * *